United States Patent
Nishimura et al.

(10) Patent No.: US 9,126,849 B2
(45) Date of Patent: Sep. 8, 2015

(54) CONTAINER CONTAINING A COBALT CARBONYL COMPLEX AND COBALT CARBONYL COMPLEX COMPOSITION

(71) Applicant: JSR CORPORATION, Tokyo (JP)

(72) Inventors: Hideki Nishimura, Tokyo (JP); Kouji Sumiya, Tokyo (JP); Yasuo Matsuki, Tokyo (JP)

(73) Assignee: JSR CORPORATION, Tokyo (JP)

( * ) Notice: Subject to any disclaimer, the term of this patent is extended or adjusted under 35 U.S.C. 154(b) by 0 days.

(21) Appl. No.: 14/531,152

(22) Filed: Nov. 3, 2014

(65) Prior Publication Data

US 2015/0050205 A1 Feb. 19, 2015

Related U.S. Application Data

(63) Continuation of application No. 13/131,485, filed as application No. PCT/JP2009/070206 on Nov. 25, 2009.

(30) Foreign Application Priority Data

Nov. 28, 2008 (JP) ................. 2008-303678
Nov. 28, 2008 (JP) ................. 2008-303679

(51) Int. Cl.
*C07F 15/00* (2006.01)
*C01G 51/02* (2006.01)
*C23C 16/16* (2006.01)
*C23C 16/448* (2006.01)
*H01L 21/285* (2006.01)
*H01L 21/768* (2006.01)

(52) U.S. Cl.
CPC ............... *C01G 51/02* (2013.01); *C23C 16/16* (2013.01); *C23C 16/4481* (2013.01); *H01L 21/28556* (2013.01); *H01L 21/76843* (2013.01); *H01L 21/76873* (2013.01)

(58) Field of Classification Search
CPC ........................................................ C07F 15/06
USPC ............................................................ 556/141
See application file for complete search history.

(56) References Cited

U.S. PATENT DOCUMENTS

| | | | |
|---|---|---|---|
| 2003/0199169 A1 | 10/2003 | Jun et al. | |
| 2007/0234955 A1 | 10/2007 | Suzuki et al. | |
| 2009/0022891 A1 | 1/2009 | Sakai et al. | |

FOREIGN PATENT DOCUMENTS

| | | |
|---|---|---|
| JP | 54-141398 | 11/1979 |
| JP | 2000-80494 | 3/2000 |
| JP | 2003-318258 | 11/2003 |
| JP | 2005-179777 | 7/2005 |
| JP | 2006-328526 | 12/2006 |
| JP | 2007-277719 | 10/2007 |

OTHER PUBLICATIONS

English translation of the International Preliminary Report on Patentability and Written Opinion of the International Searching Authority issued Jul. 14, 2011, in PCT/JP2009/070206.
"Kagaku Binran Kisohen" The Chemical Society of Japan, Sep. 1966, pp. 620, 627 (with partial English-language translation).

*Primary Examiner* — Sudhakar Katakam
(74) *Attorney, Agent, or Firm* — Oblon, McClelland, Maier & Neustadt, L.L.P.

(57) ABSTRACT

A container containing a cobalt carbonyl complex and a gas that contains carbon monoxide, and a cobalt carbonyl complex composition comprising a cobalt carbonyl complex and a solvent, wherein the concentration of carbon monoxide dissolved in the solvent is 0.001 to 1 wt %.

Since the cobalt carbonyl complex contained in the above container or the above composition can retain its sublimation properties for a long time without being converted into a stable complex, when a cobalt film is formed by chemical vapor deposition using the container and the composition, a high-quality film can be formed by a simple process, and the production cost of the cobalt film can be reduced due to high use efficiency of the precursor.

4 Claims, 1 Drawing Sheet

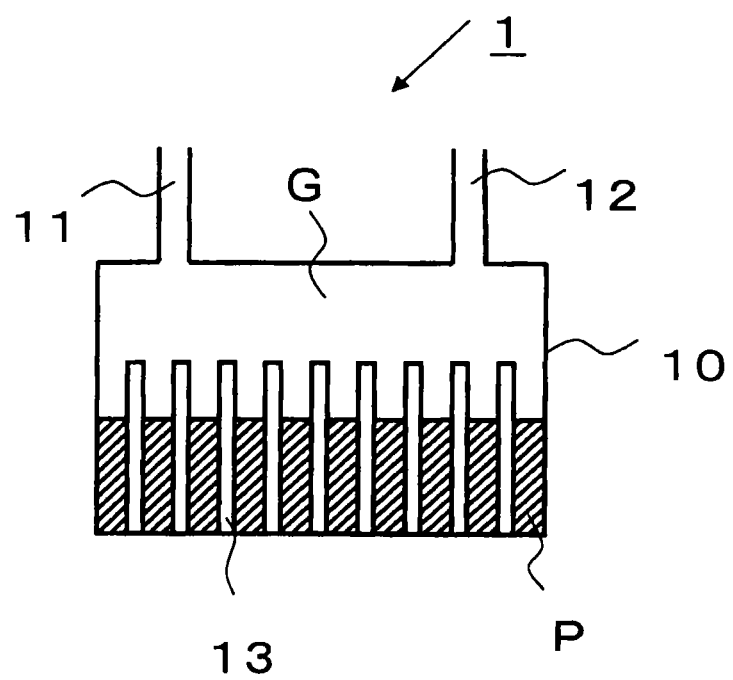

CONTAINER CONTAINING A COBALT CARBONYL COMPLEX AND COBALT CARBONYL COMPLEX COMPOSITION

This application is a continuation application of U.S. Ser. No. 13/131,485 filed on May 26, 2011 which is a 371 application of PCT/JP09/70206 filed on Nov. 25, 2009.

TECHNICAL FIELD

The present invention relates to a container containing a cobalt carbonyl complex and to a cobalt carbonyl complex composition. More specifically, it relates to a container containing a cobalt carbonyl complex, which can store a cobalt carbonyl complex stably and can be advantageously used to form a cobalt film and to a cobalt carbonyl complex composition.

BACKGROUND ART

In electronic devices such as DRAM (Dynamic Random Access Memory), the structures of wires and electrodes are becoming finer and more complex to achieve higher performance, and the improvement of accuracy is now desired for the shapes of these devices.

To form electrodes and wires in electronic devices, in general, trenches are formed at positions where wires or electrodes are to be formed on a substrate, a metal material which will become wires or electrodes is buried in the trenches, and excess is removed by chemical mechanical polishing or the like.

Copper which has high conductivity has been widely used as an electrode material or a wire material which is buried in the trenches. To bury copper in the trenches, a plating method is advantageous because it has an advantage that copper can be buried even in trenches having a high aspect ratio at a high filling rate (refer to JP-A 2000-80494 and JP-A 2003-318258).

When a substrate having the trenches is an insulator having no conductivity (such as a substrate made of silicon oxide), a conductive layer (seed layer) which is a primary coat for plating must be formed on the surface of the substrate prior to plating. It is known that when copper comes in contact with an insulator typified by silicon oxide, a phenomenon (generally called "migration") that a copper atom moves to the insulator from the copper layer occurs. When the migration of the copper atom occurs at the interface between copper and the insulator in an electronic device, the electric properties of the device are impaired. Therefore, a barrier layer must be formed between the insulator and copper of the electronic device.

In recent years, there has been proposed a technology for attaining the above object by using cobalt as a material which serves as a seed layer for burying copper into trenches by plating and also as a barrier layer at the interface between the insulator and copper and by using a special chemical vapor deposition method (refer to JP-A 2006-328526). In the technology disclosed by the above publication, a first substrate on which a cobalt film is to be formed and a second substrate having a cobalt precursor thereon are arranged close to each other and opposed to each other, and a cobalt precursor sublimating from the second substrate is supplied onto the first substrate and converted into cobalt on the first substrate so as to form a cobalt film. The above publication discloses octacarbonyl dicobalt as the cobalt precursor. With this technology, a cobalt film which is uniform in thickness even in the inside of each trench and has high adhesion can be easily formed even when a substrate having trenches with a high aspect ratio is used. Therefore, the above object is attained.

However, it is known that an ordinary cobalt precursor such as octacarbonyl dicobalt has a storage stability problem that it is gradually converted into a stable complex having low sublimation properties during storage. When this cobalt complex including a stable complex is used as the precursor in the chemical vapor deposition method, the stable complex does not sublimate and remains. Therefore, it is necessary to prepare the precursor used for the chemical vapor deposition method in an amount which is much larger than its theoretical value calculated from the weight of the cobalt film to be formed. Since the above residue cannot be reused as the cobalt precursor in the chemical vapor deposition method, the formation of the cobalt film by the chemical vapor deposition method becomes excessively costly.

DISCLOSURE OF THE INVENTION

It is an object of the present invention which has been made in view of the above situation to provide means by which a cobalt carbonyl complex can be stored stably and is advantageously used for the formation of a cobalt film by a chemical vapor deposition method after storage.

The inventors of the present invention conducted studies to attain the above object and found that a cobalt carbonyl complex has excellent stability when it is stored in the presence of carbon monoxide. They also found that especially when the cobalt carbonyl complex is stored in a gas containing carbon monoxide or a solution containing carbon monoxide, it can be stored extremely stably and even when it is stored for a long time, the cobalt carbonyl complex does not lose its sublimation properties after storage and can be advantageously used in the chemical vapor deposition method. The present invention was accomplished based on these findings.

That is, according to the present invention, firstly, the above objects and advantages of the present invention are attained by a container containing a cobalt carbonyl complex and a gas, wherein the gas contains carbon monoxide.

Secondly, the above objects and advantages of the present invention are attained by a cobalt carbonyl complex composition comprising a cobalt carbonyl complex and a solvent, wherein the concentration of carbon monoxide dissolved in the solvent is 0.001 to 1 wt %.

BRIEF DESCRIPTION OF THE DRAWINGS

FIG. 1 is a schematic sectional view of a container containing a cobalt carbonyl complex according to an embodiment of the present invention.

EXPLANATION OF REFERENCE SYMBOLS

1: container containing a cobalt carbonyl complex
10: container body
11: gas introduction port
12: gas exhaust port
13: partition
P: cobalt carbonyl complex
G: gas containing carbon monoxide

BEST MODE FOR CARRYING OUT THE INVENTION

The present invention will be described in detail hereinunder. "ppm" in the following description is based on volume when it is used for a gas and based on weight when it is used for a liquid (solution or solvent).

Cobalt Carbonyl Complex

The cobalt carbonyl complex in the present invention is a cobalt complex having carbon monoxide as a ligand, such as a complex represented by any one of the following formulas (1) to (4).

$$Co_2(CO)_8 \quad (1)$$

$$Co_3(CO)_9CZ \quad (2)$$

(Z is a hydrogen atom, halogen atom, methyl group, methoxy group or trifluoromethyl group.)

$$Co_3(CO)_{12} \quad (3)$$

$$Co_4(CO)_{12} \quad (4)$$

The cobalt carbonyl complex represented by the above formula (2) is, for example, a complex represented by the following formula (i)

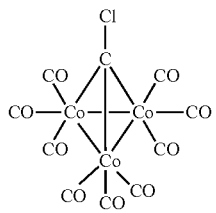

(i)

The cobalt carbonyl complex in the present invention is preferably a complex represented by the above formula (1) or (4), particularly preferably octacarbonyl dicobalt.

It is known that when the cobalt carbonyl complex is stored by a method commonly used by people having ordinary skill in the art, it is gradually converted into a stable complex and its sublimation properties are lost. However, when it is stored in the presence of carbon monoxide, it can be stored stably. Particularly when it is stored in a gas containing carbon monoxide or a solution containing carbon monoxide, it can be stored very stably. This knowledge discovered by the inventors of the present invention has produced the following two embodiments.

A first embodiment of the present invention is a container containing a cobalt carbonyl complex and a gas, wherein the gas contains carbon monoxide.

A second embodiment of the present invention is a cobalt complex composition comprising a cobalt carbonyl complex and a solvent, wherein the concentration of carbon monoxide dissolved in the solvent is 0.001 to 1 wt %.

The two embodiments of the present invention will be described hereinunder.

Container Containing a Cobalt Carbonyl Complex

The container containing a cobalt carbonyl complex according to the first embodiment of the present invention is a container containing a cobalt carbonyl complex and a gas, wherein the gas contains carbon monoxide as described above.

Gas

The gas stored in the container containing a cobalt carbonyl complex of the present invention may be a gas composed of carbon monoxide alone or a mixed gas of carbon monoxide and another gas. The other gas which may be used herein is preferably an inert gas such as nitrogen, argon or helium.

The concentration of carbon monoxide contained in the gas contained in the container containing a cobalt carbonyl complex of the present invention is preferably 10 to 100 vol %, more preferably 30 to 100 vol %, much more preferably 50 to 100 vol %. Further, the gas contained in the container preferably contains substantially no oxygen. More specifically, the concentration of oxygen contained in the gas is preferably not more than 500 ppm, more preferably not more than 100 ppm, much more preferably not more than 50 ppm, particularly preferably not more than 10 ppm. When the above gas is contained in the container together with the cobalt carbonyl complex, the storage stability of the cobalt carbonyl complex is significantly enhanced and even when the cobalt carbonyl complex is stored for a long time, the cobalt carbonyl complex is hardly converted into a stable complex having low sublimation properties.

The inside pressure of the container containing a cobalt carbonyl complex is not particularly limited but preferably $5 \times 10^2$ to $1 \times 10^7$ N/m$^2$, more preferably $1 \times 10^3$ to $1 \times 10^6$ N/m$^2$, much more preferably $5 \times 10^3$ to $1 \times 10^5$ N/m$^2$, particularly preferably $1 \times 10^4$ to $1.2 \times 10^5$ N/m$^2$.

The partial pressure of carbon monoxide in the container containing a cobalt complex is not particularly limited but preferably $5 \times 10^1$ to $1 \times 10^7$ N/m$^2$, more preferably $5 \times 10^2$ to $1 \times 10^6$ N/m$^2$, much more preferably $1 \times 10^3$ to $5 \times 10^5$ N/m$^2$, particularly preferably $5 \times 10^3$ to $1.2 \times 10^5$ N/m$^2$, most preferably $1 \times 10^4$ to $1.1 \times 10^5$ N/m$^2$.

To contain the gas containing carbon monoxide in the container, for example, a method in which the cobalt carbonyl complex is contained in the container in the gas containing carbon monoxide, or a method in which the cobalt carbonyl complex is contained in the container filled with the gas containing carbon monoxide may be employed.

Container

A container which can contain the above-described cobalt carbonyl complex and the above-described gas, can store them hermetically and preferably has a structure and a material that enable the cobalt carbonyl complex to sublimate therefrom can be advantageously used as the container containing a cobalt carbonyl complex of the present invention.

Preferably, the above container has a container body and a lid which can close up the container when it is mated with the container body, or has a container body and a gas introduction port and a gas exhaust port formed in the container body. In the case of the latter, the above gas introduction port and the gas exhaust port are closed up with a lid during storage.

The outer shape of the container body may be cylindrical or polygonal columnar. The volume of the container body is preferably $1 \times 10^1$ to $1 \times 10^6$ cm$^3$, more preferably $5 \times 10^2$ to $5 \times 10^5$ cm$^3$. The material of the container body is not particularly limited if it has low reactivity with the cobalt carbonyl complex and can withstand heat at the time of sublimation, and examples thereof include stainless steel, aluminum, polysilicon, titanium, other metals and alloys comprising two or more of them; plastics such as polytetrafluoroethylene and polyethylene; and ceramic materials or glasses such as quartz, borosilicate glass, pure glass, boron nitride and silicon carbide. Out of these, metals such as stainless steel and alloys are preferred.

At least partitions or a filler may be provided in the container. When at least partitions or a filler is provided in the container, the heat transmission area can be made large during the sublimation of the cobalt carbonyl complex from the container, thereby making it possible to heat the complex uniformly and carry out stable and efficient sublimation advantageously. When the cobalt carbonyl complex is locally heated, conversion into a stable complex readily occurs from that portion. When at least partitions or a filler is provided in the container, this can be avoided.

The above partitions are for dividing the inside of the container into a plurality of chambers and preferably do not reach the top of the container. The volume of each chamber divided by the partitions is, for example, $1 \times 10^0$ to $1 \times 10^5$ cm$^3$. The partitions may have a portion (for example, a hole) communicating with adjacent chambers. The material of the partitions may be the same as those enumerated for the material of the container body, and is preferably the same as the material of the container body.

The above filler is a material which fills the inside of the container with a certain void ratio and preferably fills 1 to 90 vol % of a lower portion of the container with a void ratio of preferably 10 to 80 vol %. The material of the filler is, for example, stainless steel, glass, ceramic or fluororesin, preferably stainless steel. The shape of the filler is, for example, spherical, polygonal columnar, cylindrical, coil-like, spring-like or fibrous. Examples of the filler include packings for distillation such as DIXON Packing, HELI PACK and Fenske. The size of each unit material constituting the filler is, for example, 0.1 to 10 mm.

The filling rate of the cobalt carbonyl complex in the container containing a cobalt carbonyl complex of the present invention is preferably 1 to 80 vol %, more preferably 20 to 60 vol % of the volume of the container body.

The container containing a cobalt carbonyl complex according to a preferred embodiment of the present invention will be described in more detail hereinunder with reference to the accompanying drawing.

FIG. 1 is a schematic sectional view of the container containing a cobalt carbonyl complex according to the embodiment of the present invention.

The container 1 containing a cobalt carbonyl complex shown in FIG. 1 has a container body 10 and a gas introduction port 11 and a gas exhaust port 12 formed in the container body 10. The gas introduction port 11 and the gas exhaust port 12 are closed up with a sealable lid (not shown) during storage. The container 1 further has a plurality of partitions 13 for dividing the container body into a plurality of chambers. The partitions 13 do not reach the top of the container body, and a fluid can move from the gas introduction port 11 to the gas exhaust port 12 through the chambers. A cobalt carbonyl complex P is contained in each chamber, and a gas G containing carbon monoxide is contained in remaining spaces in the container body and the chambers.

When the cobalt carbonyl complex is to be stored in the above-described container containing a cobalt carbonyl complex, it is stored in a gas containing carbon monoxide which increases the stability of the cobalt carbonyl complex significantly. Therefore, the cobalt carbonyl complex can be stored stably for a long time without being converted into a stable complex having low sublimation properties. The temperature for storing the cobalt carbonyl complex is preferably −30 to 80° C., more preferably 10 to 50° C., particularly preferably 35 to 50° C. Since the container containing a cobalt carbonyl complex of the present invention can be used for sublimation as it is so as to form a cobalt film, it has an advantage that the formation of a cobalt film can be carried out efficiently by a very simple process.

Method of Forming a Cobalt Film

A description is subsequently given of a method of forming a cobalt film by chemical vapor deposition using the above container containing a cobalt carbonyl complex.

The method of forming a cobalt film is characterized in that the above container containing a cobalt carbonyl complex is heated to sublimate the cobalt carbonyl complex from the container so as to supply a sublimate onto a substrate and convert the cobalt carbonyl complex into cobalt on the substrate. Thereby, the cobalt carbonyl complex can be sublimated at a high efficiency and converted into cobalt.

Heating for sublimating the cobalt carbonyl complex from the container containing a cobalt carbonyl complex is carried out to ensure that the temperature of the cobalt carbonyl complex contained in the container becomes preferably 25 to 150° C., more preferably 30 to 100° C., much more preferably 35 to 50° C. The inside pressure of the container for sublimating the cobalt carbonyl complex is preferably $1 \times 10^1$ to $1 \times 10^6$ N/m$^2$, more preferably $1 \times 10^2$ to $5 \times 10^6$ N/m$^2$, much more preferably $5 \times 10^1$ to $1.2 \times 10^5$ N/m$^2$.

To supply the sublimate of the above cobalt carbonyl complex onto the substrate, the generated sublimate is carried to a position near the substrate by a suitable carrier gas or a pressure difference. To carry the sublimate to a position near the substrate by a carrier gas, it is convenient that a container having a container body and a gas introduction port and a gas exhaust port formed in the container body should be used and installed in such a manner that the gas exhaust port is located near the substrate and the container should be heated while the carrier gas is introduced from the gas introduction port. Examples of the carrier gas used herein include inert gases such as nitrogen, argon and helium, and reducing gases such as hydrogen and carbon monoxide. To supply the sublimate to a position near the substrate by a pressure difference, it is convenient that a container having a container body and a gas introduction port and a gas exhaust port formed in the container body should be used, a substrate should be placed in a reactor different from the container, the gas exhaust port of the container should be connected to the reactor, and a vacuum pump should be used to reduce the inside pressure of the reactor.

The cobalt carbonyl complex supplied onto the substrate is converted into cobalt on the substrate, thereby forming a cobalt film on the substrate. The conversion of the cobalt carbonyl complex into cobalt on the substrate may be carried out by heating the surface of the substrate. The temperature of the surface of the substrate for converting the cobalt carbonyl complex into cobalt is preferably 50 to 300° C., more preferably 70 to 250° C., much more preferably 100 to 200° C.

The material of the substrate on which a cobalt film is to be formed by the method of forming a cobalt film by using the container containing a cobalt carbonyl complex and the feature of the cobalt film to be formed will be described hereinafter.

Cobalt Carbonyl Complex Composition

The cobalt carbonyl complex composition according to the second embodiment of the present invention is a composition comprising a cobalt carbonyl complex and a solvent, wherein concentration of carbon monoxide dissolved in the solvent is 0.001 to 1 wt %.

The concentration of the cobalt carbonyl complex in the cobalt carbonyl complex composition of the present invention is preferably 0.1 to 50 wt %, more preferably 1 to 30 wt %.

Solvent

Examples of the solvent contained in the cobalt carbonyl complex composition of the present invention include aliphatic hydrocarbons, alicyclic hydrocarbons, aromatic hydrocarbons, alcohols, ethers, ketones and halogenated hydrocarbons. At least one of them is preferably used.

The above aliphatic hydrocarbons include n-hexane, n-heptane, n-octane, n-nonane and n-decane; the above alicyclic hydrocarbons include cyclohexane, cycloheptane and cyclooctane; the above aromatic hydrocarbons include benzene, toluene and xylene; the above alcohols include methanol, ethanol, propanol, isopropanol and butanol; the above ethers include diethyl ether, dipropyl ether, dibutyl ether, ethylene glycol dimethyl ether, ethylene glycol diethyl ether, ethylene glycol methyl ethyl ether, diethylene glycol dimethyl ether, diethylene glycol diethyl ether, diethylene glycol methyl ethyl ether, tetrahydrofuran, tetrahydropyran and p-oxane; the above ketones include acetone, methyl ethyl ketone, cyclohexanone and diethyl ketone; and the above halogenated hydrocarbons include methylene chloride, tetrachloroethane, chloromethane and chlorobenzene.

At least one solvent selected from the group consisting of n-pentane, n-hexane, n-heptane, cyclopentane, xylene and toluene out of these is preferably used, and at least one solvent selected from the group consisting of n-hexane and toluene is particularly preferably used.

The concentration of carbon monoxide dissolved in the solvent is preferably 0.005 to 0.5 wt %, more preferably 0.05 to 0.3 wt %. The concentration of carbon monoxide dissolved in the solvent is preferably 0.001 to 100 moles, more preferably 0.01 to 10 moles, much more preferably 0.05 to 5 moles, particularly preferably 0.1 to 1 mole based on 1 mole of the cobalt carbonyl complex. When the concentration of carbon monoxide dissolved in the solvent falls within the above range, the stability of the cobalt carbonyl complex in the solution becomes very high, whereby when the cobalt carbonyl complex composition is stored for a long time, conversion into a stable complex hardly occurs. The temperature for storing the cobalt carbonyl complex composition is preferably −30 to 80° C., more preferably 10 to 50° C., particularly preferably 35 to 50° C. When a cobalt film is formed from this cobalt carbonyl complex composition by chemical vapor deposition, the use efficiency of the cobalt carbonyl complex becomes high.

The concentration of oxygen dissolved in the solvent is preferably not more than 500 ppm, more preferably not more than 100 ppm, much more preferably not more than 50 ppm, particularly preferably not more than 10 ppm.

Other Components

The cobalt carbonyl complex composition of the present invention comprises a cobalt carbonyl complex and a solvent and has a concentration of carbon monoxide dissolved in the solvent of 0.001 to 1 wt %. As long as the effect of the present invention is not impaired, it may optionally comprise other components. The other components include a surfactant, a silane coupling agent and a polymer.

Method of Producing a Cobalt Carbonyl Complex Composition

The cobalt carbonyl complex composition of the present invention can be produced, for example, by a method comprising the steps of:

bubbling a gas containing carbon monoxide into a solvent; and dissolving a cobalt carbonyl complex in the solvent obtained by the above step, or a method comprising the steps of:

dissolving a cobalt carbonyl complex in a solvent to produce a cobalt carbonyl complex solution; and bubbling a gas containing carbon monoxide into the obtained cobalt carbonyl complex solution.

When the cobalt carbonyl complex composition of the present invention comprises the above other components, the other components may be added at any time in any one of the above steps.

The temperature of the solvent in the step of bubbling a gas containing carbon monoxide into the solvent or the cobalt carbonyl complex solution is preferably −80 to 100° C., more preferably −30 to 50° C., much more preferably −10 to 30° C.

The gas containing carbon monoxide is a gas composed of carbon monoxide alone or a mixed gas of carbon monoxide and another gas. Preferred examples of the other gas used in the latter include inert gases such as nitrogen, argon and helium. When a mixed gas of carbon monoxide and another gas is used as the gas containing carbon monoxide, the concentration of carbon monoxide contained in the mixed gas is preferably not less than 10 vol %, more preferably not less than 25 vol %, much more preferably not less than 50 vol %, particularly preferably not less than 75 vol %.

The gas containing carbon monoxide preferably contains substantially no oxygen. More specifically, the concentration of oxygen in the gas is preferably not more than 500 ppm, more preferably not more than 100 ppm, much more preferably not more than 50 ppm, particularly preferably not more than 10 ppm The cobalt carbonyl complex composition of the present invention preferably contains substantially no oxygen dissolved therein. More specifically, the concentration of oxygen dissolved in the composition is preferably not more than 500 ppm, more preferably not more than 100 ppm, much more preferably not more than 50 ppm, particularly preferably not more than 10 ppm. To reduce the concentration of oxygen dissolved in the composition, a method using a solvent which has been bubbled with a gas containing substantially no oxygen and a method using a solvent which has been deaerated by heating is used. In the case of the former method, it is preferred to use a gas containing carbon monoxide as the gas used for bubbling because the number of steps for producing the cobalt carbonyl complex composition of the present invention can be reduced.

Method of Forming a Cobalt Film

A description is subsequently given of the method of forming a cobalt film from the above cobalt carbonyl complex composition by chemical vapor deposition.

The method of forming a cobalt film is characterized in that a cobalt carbonyl complex derived from the above cobalt carbonyl complex composition is sublimated, supplied onto a substrate and converted into cobalt on the substrate. Thereby, the cobalt carbonyl complex contained in the cobalt carbonyl complex composition can be sublimated at a high efficiency and converted into cobalt.

To sublimate the cobalt carbonyl complex derived from the cobalt carbonyl complex composition, after the solvent is removed from the composition, the cobalt carbonyl complex may be sublimated from the residue, or the cobalt carbonyl complex may be sublimated simultaneously with the evaporation of the solvent from the composition.

In the case of the former method, the removal of the solvent from the cobalt carbonyl complex composition can be carried out by a method in which an inert gas, a reducing gas or a mixture thereof is let pass through the composition, a method in which the composition is heated, or a method in which the composition is put under a reduced pressure. Out of these, the method in which an inert gas, a reducing gas or a mixture thereof is let pass through the cobalt carbonyl complex composition is preferred. Examples of the inert gas and the reducing gas used in the method are the same as those enumerated above. The temperature of the composition at the time of aeration is preferably kept at 10 to 50° C. The sublimation of the cobalt carbonyl complex which is carried out subsequently can be carried out by heating the residue after the removal of the solvent at preferably 25° C. or higher, more preferably 40 to 500° C., much more preferably 40 to 300° C.

Meanwhile, in the case of the latter method in which the cobalt carbonyl complex is sublimated simultaneously with the evaporation of the solvent from the cobalt carbonyl complex composition, the composition is kept at preferably 25 to 100° C., more preferably 30 to 100° C., much more preferably 35 to 50° C. for preferably 0.1 to 60 minutes, more preferably 1 to 20 minutes. The atmosphere for the removal of the solvent is preferably an atmosphere of an inert gas such as nitrogen, argon or helium, a reducing gas such as hydrogen or carbon monoxide, or a mixture thereof.

It is particularly preferred that the cobalt carbonyl complex should be sublimated from the residue after the solvent is removed from the cobalt carbonyl complex composition. In this case, the solvent removed from the cobalt carbonyl complex composition is preferably discharged to the outside of the system.

To supply a sublimate of the above cobalt carbonyl complex onto the substrate, a method in which the sublimation of the above cobalt carbonyl complex is carried out in the vicinity of the substrate or a method in which the sublimation of the cobalt carbonyl complex is carried out away from the substrate or in another reactor (chamber) and the produced sublimate is carried to a position near the substrate by using a suitable carrier gas or a pressure difference may be employed.

In the method in which the sublimation of the above cobalt carbonyl complex is carried out in the vicinity of the substrate, for example, the cobalt carbonyl complex is sublimated while the cobalt carbonyl complex composition contained in a suitable container is placed near the substrate, or the cobalt carbonyl complex is sublimated while the surface on which a cobalt film is to be formed of the substrate and the composition placed surface of another substrate are opposed to each other after the composition is placed on the surface of the other substrate different from the substrate on which the cobalt film is to be formed. At this point, the solvent is preferably removed from the cobalt carbonyl complex composition placed on the other substrate in advance.

Out of these, the latter method using the other substrate is preferred. The other substrate is not particularly limited as long as a coating film of the above cobalt carbonyl complex composition can be formed by coating and the substrate can withstand heat for the sublimation of the cobalt carbonyl complex. A substrate made of the same material as that of the substrate on which the cobalt film is to be formed may be used. The shape of the other substrate is not particularly limited but a shape having a surface to be mated with at least part of a portion (surface) on which the cobalt film is to be formed of the substrate is preferred. The cobalt carbonyl complex composition may be placed on the surface of the other substrate, for example, by coating the surface of the other substrate with the above cobalt carbonyl complex composition.

Meanwhile, when the sublimation of the cobalt carbonyl complex is carried out away from the substrate or in the other reactor (chamber) and the produced sublimate is carried to a position near the substrate by a suitable carrier gas, the used carrier gas is an inert gas, a reducing gas or a mixture thereof. Examples of the gas are the same as those enumerated above. When the sublimation of the cobalt carbonyl complex is carried out away from the substrate or in the other reactor (chamber) and the produced sublimate is carried to a position near the substrate by a pressure difference, the inside pressure of the reactor is reduced by using a vacuum pump to carry the cobalt carbonyl complex into the reactor.

The cobalt carbonyl complex supplied onto the substrate is converted into cobalt on the substrate, thereby forming a cobalt film on the substrate. The conversion of the cobalt carbonyl complex into cobalt on the substrate may be carried out by heating the surface of the substrate.

The temperature of the surface of the substrate for converting the cobalt carbonyl complex into cobalt is preferably 50 to 300° C., more preferably 50 to 250° C., much more preferably 50 to 150° C.

Substrate

Examples of the material of the substrate on which the cobalt film is to be formed by chemical vapor deposition using the container containing a cobalt carbonyl complex or the cobalt carbonyl complex composition include glasses, metals, metal nitrides, silicon, resins and insulating films. The above glasses include quartz glass, borate glass, soda glass and lead glass. The above metals include gold, silver, copper, nickel, aluminum and iron. The above metal nitrides include titanium nitride, tantalum nitride and tungsten nitride. The above resins include polyethylene terephthalate, polyimide and polyether sulfone. The above insulating films include silicon oxide, titanium oxide, zirconium oxide, hafnium oxide, tantalum oxide and niobium oxide, insulating film called "SOG", and insulating film having a low dielectric constant formed by CVD. Examples of the above silicon oxide include a thermally oxide film, PETEOS (Plasma Enhanced TEOS) film, HDP (High Density Plasma Enhanced TEOS) film, BPSG (Boron Phosphorus Silicate Glass) film and FSG (Fluorine Doped Silicate Glass) film.

The above thermally oxide film is formed by placing silicon in a high-temperature oxidizing atmosphere. The PETEOS film is formed from tetraethyl orthosilicate (TEOS) by chemical vapor deposition making use of plasma as an acceleration condition. The HDP film is formed from tetraethyl orthosilicate (TEOS) by chemical vapor deposition making use of high-density plasma as an acceleration condition. The BPSG film can be obtained, for example, by normal-pressure or vacuum CVD. The FSG film is formed by chemical vapor deposition making use of high-density plasma as an acceleration condition.

The above SOG stands for Spin On Glass and refers to an insulating film having a low dielectric constant obtained by spin coating a liquid mixture prepared by dissolving or dispersing a silicate compound as a precursor in an organic solvent to a substrate and heating it. The silicate compound as a precursor is, for example, silsesquioxane. Commercially available products of the insulating film called "SOG" include Coral (of Nuvellus System Inc.), Aurola (of ASM Japan K.K.), Nonaglass (of Honeywell International Inc.) and LKD (of JSR Corporation). The material forming the substrate is preferably a silicon oxide film, insulating film called "SOG" or insulating film having a low dielectric constant formed by CVD, more preferably a silicon oxide film, much more preferably a PETEOS film, BPSG film or FSG film.

The substrate may have a barrier layer formed on the surface. Examples of the material of the barrier layer include tantalum, titanium, tantalum nitride and titanium nitride, out of which tantalum and tantalum nitride are preferred.

The substrate on which a cobalt film is to be formed produces the advantageous effect of the present invention when it has trenches. The trenches are formed in the substrate made of the above material by a known method such as photolithography.

Although the trenches may be of any shape or any size, when the opening width (the minimum distance of a portion open to the surface of the substrate) of each trench is 10 to 300 nm and the aspect ratio (a value obtained by dividing the depth of the trench to the opening width of the trench) of the trench is 3 or more, the advantageous effect of the present invention is produced to a maximum extent. The opening width of the trench may be 10 to 200 nm, specifically 10 to 100 nm, more specifically 10 to 50 nm. The aspect ratio of the trench may be 3 to 40, specifically 5 to 25.

Cobalt Film

The thickness of the cobalt film formed by using the container containing a cobalt carbonyl complex of the present invention or the cobalt carbonyl complex composition of the present invention is preferably 1 to 1,000 nm, more preferably 10 to 500 nm.

The method of forming the above cobalt film can be advantageously applied to a seed layer for burying copper in trenches by plating and a barrier layer at the interface between an insulator and copper because the cobalt precursor can be sublimated at a high efficiency and converted into cobalt and the cobalt film formed on the substrate is homogeneous with a uniform thickness and high quality as obvious from examples which will be given hereinafter.

EXAMPLES

Manufacture of Container Containing a Cobalt Carbonyl Complex and Storage Stability Test Example A-1

Manufacture of Container Containing a Cobalt Carbonyl Complex

Octacarbonyl dicobalt was prepared as the cobalt carbonyl complex. 10 g of the above octacarbonyl dicobalt was contained in a SUS304 container having a capacity of 100 ml in a carbon monoxide atmosphere (1 atm, oxygen concentration of 1 ppm), and the container was closed up with a lid to manufacture a container containing a cobalt carbonyl complex.

Evaluation of Storage Stability

The container containing a cobalt carbonyl complex manufactured above was left and kept in a 40° C. oven (filled with air) for 1 month.

After 1 month of storage, the content was taken out from the container containing a cobalt carbonyl complex in a nitrogen atmosphere. The content was dissolved in a mixed solvent of deuterated toluene and hexane in a weight ratio of 1:1 to a concentration of 5 wt %. $^{59}$Co-NMR measurement was made on this solution to check the conversion of the cobalt carbonyl complex into dodecacarbonyl tetracobalt as a stable complex. The change rate as the proportion of the weight of dodecacarbonyl tetracobalt to the weight of the whole cobalt carbonyl complex after storage was 0%.

Comparative Example A-1

A container containing a cobalt carbonyl complex was manufactured in the same manner as in Example A-1 except that the atmosphere for containing octacarbonyl dicobalt in the container was changed to a nitrogen atmosphere (1 atm, oxygen concentration of 1 ppm) to evaluate its storage stability. The change rate after 1 month of storage at 40° C. was 6%.

Example A-2

A container containing a cobalt carbonyl complex was manufactured in the same manner as in Example A-1. The container containing a cobalt carbonyl complex was left and kept in a 70° C. oven (filled with air) for 12 hours.

When the change rate after storage was measured in the same manner as in Example A-1 after 12 hours, it was 55%.

Comparative Example A-2

A container containing a cobalt carbonyl complex was manufactured in the same manner as in Example A-2 except that the atmosphere for containing octacarbonyl dicobalt in the container was changed to a nitrogen atmosphere (1 atm, oxygen concentration of 1 ppm) to evaluate its storage stability. The change rate after 12 hours of storage at 70° C. was 80%.

Cobalt Film Formation Test

Example A-3

Manufacture of Container Containing a Cobalt Carbonyl Complex

Octacarbonyl dicobalt was prepared as the cobalt carbonyl complex.

A SUS304 container having a container body with a capacity of 100 ml and a gas introduction port and a gas exhaust port formed in the container body was prepared as the container.

500 mg of octacarbonyl dicobalt was contained in the above container in a carbon monoxide atmosphere (1 atm, oxygen concentration of 1 ppm), and the gas introduction port and the gas exhaust port were closed up to manufacture a container containing a cobalt carbonyl complex.

Storage

The container containing a cobalt carbonyl complex manufactured above was left and kept in an 40° C. oven (filled with air) for 1 month.

Formation of Cobalt Film

After one month, the gas introduction port of the container containing a cobalt carbonyl complex after storage was connected to a nitrogen supply source and the gas exhaust port was connected to a reactor in which a substrate (silicon wafer having a diameter of 100 mm) was set.

Then, the substrate was heated on a hot place installed at the back to raise the temperature of the surface of the substrate to 120° C. Subsequently, the container containing a cobalt carbonyl complex was heated with an oil bath to raise the temperature of octacarbonyl dicobalt to 40° C. so as to sublimate it while nitrogen was let flow from the gas introduction port as a carrier gas at a rate of 1 liter (SATP)/min, and the sublimate was supplied onto the substrate placed in a reactor through the gas exhaust port by the above carrier gas. As a result, a silver white film having a thickness of 160 nm was formed on the substrate. When SIMS analysis (secondary ion mass spectrometry) was made on this film, it was found that this film was made of cobalt metal. The resistivity of this cobalt film was 18 µΩcm.

After the formation of the cobalt film, the weight of the cobalt carbonyl complex remaining in the container was 0 mg, and the residual ratio was 0%.

Comparative Example A-3

When a container containing a cobalt carbonyl complex was manufactured in the same manner as in Example A-3 except that the atmosphere for containing octacarbonyl dicobalt in the container was changed to a nitrogen atmosphere (1 atm, oxygen concentration of 1 ppm) and then a cobalt film was formed after this container was left and kept at 40° C. for 1 month, a silver white film having a thickness of 150 nm was formed on the substrate. When SIMS analysis was made on this film, it was found that this film was made of cobalt metal. The resistivity of this cobalt film was 18 µΩcm.

After the formation of the cobalt film, the weight of the cobalt carbonyl complex remaining in the container was 2 mg, and the residual ratio was 6.7%.

Stability Test of Cobalt Carbonyl Complex Composition

Example B-1

(1) Preparation of Cobalt Carbonyl Complex Composition 20 g of octacarbonyl dicobalt was dissolved in 180 g of hexane into which carbon monoxide had been bubbled at a flow rate of 1 liter (NTP)/min at 25° C. for 2 minutes to prepare a cobalt carbonyl complex composition having an octacarbonyl dicobalt concentration of 10 wt %. All these operations were conducted in a carbon monoxide atmosphere. When the concentration of carbon monoxide dissolved in the above hexane used as a solvent was measured by gas chromatography (6890N of Agilent Technologies Inc.), it was 0.12 wt %. The concentration of oxygen contained in hexane was 1 ppm.

(2) Storage of Cobalt Carbonyl Complex Composition 200 g of the above cobalt carbonyl complex composition was put into a 500 ml container in a carbon monoxide atmosphere, and the container was closed up with a lid. This container was left and kept in a 40° C. oven for 1 month.

(3) Analysis of Cobalt Carbonyl Complex Composition After Storage

Part of the content was taken out from the above container in a nitrogen atmosphere and dissolved in a mixed solvent of deuterated toluene and n-hexane in a weight ratio of 1:1 to prepare a solution having a concentration of 5 wt %. $^{59}$Co-NMR measurement was made on this solution to check the ratio of octacarbonyl dicobalt and dodecacarbonyl tetracobalt. Dodecacarbonyl tetracobalt was not found in the composition after storage, and the change rate of octacarbonyl dicobalt into dodecacarbonyl tetracobalt (ratio of the weight of dodecacarbonyl tetracobalt to the whole weight of the cobalt complex contained in the composition after storage) was 0%.

Example B-2

A cobalt carbonyl complex composition was prepared in the same manner as in Example B-1 except that the gas used for bubbling the solvent was changed to a mixed gas having a monoxide concentration of 75 vol % and a nitrogen concentration of 25 vol % and that all the operations were conducted in an atmosphere of a mixed gas having a monoxide concentration of 75 vol % and a nitrogen concentration of 25 vol % in "(1) preparation of cobalt carbonyl complex composition" of Example B-1. The solvent had a carbon monoxide content of 0.09 wt % and an oxygen content of 1 ppm.

When the above composition was kept for 1 month in the same manner as in Example B-1 and analyzed, the change rate of octacarbonyl dicobalt into dodecacarbonyl tetracobalt after storage was 0%.

Example B-3

A cobalt carbonyl complex composition was prepared in the same manner as in Example B-1 except that the gas used for bubbling the solvent was changed to a mixed gas having a monoxide concentration of 50 vol % and a nitrogen concentration of 50 vol % and that all the operations were conducted in an atmosphere of a mixed gas having a monoxide concentration of 50 vol % and a nitrogen concentration of 50 vol % in "(1) preparation of cobalt carbonyl complex composition" of Example B-1. The solvent had a carbon monoxide content of 0.06 wt % and an oxygen content of 1 ppm.

When the above composition was kept for 1 month in the same manner as in Example B-1 and analyzed, the change rate of octacarbonyl dicobalt into dodecacarbonyl tetracobalt after storage was 1%.

Comparative Example B-1

A cobalt carbonyl complex composition was prepared in the same manner as in Example B-1 except that the gas used for bubbling the solvent was changed to a nitrogen and that all the operations were conducted in a nitrogen atmosphere in "(1) preparation of cobalt carbonyl complex composition" of Example B-1. The solvent had a carbon monoxide content of 0.00 wt % and an oxygen content of 1 ppm.

When the above composition was kept for 1 month in the same manner as in Example B-1 and analyzed, the change rate of octacarbonyl dicobalt into dodecacarbonyl tetracobalt after storage was 10%.

Cobalt Film Formation Test

Example B-4

A silicon wafer (first substrate) having a tantalum nitride film with a thickness of 50 nm as a substrate on which a cobalt film was to be formed and a silicon wafer (second substrate) as another substrate were prepared.

(1) Formation of Cobalt Carbonyl Complex Film on Second Substrate

The cobalt carbonyl complex composition which had been left and kept for 1 month in the above Example B-1 as the cobalt carbonyl complex composition was applied to one side of the second substrate in a nitrogen atmosphere by spin coating to form a uniform film of the cobalt carbonyl complex having a thickness of about 3 µm on the second substrate. The weight of this film was 30 mg.

(2) Formation and Evaluation of Cobalt Film on First Substrate

The surface having a tantalum nitride film of the above first substrate and the surface having the cobalt carbonyl complex film of the second substrate were opposed to each other with a distance of 2.0 mm therebetween in a nitrogen atmosphere. At this point, the first substrate was arranged above the second substrate. The back surface of the first substrate was brought into contact with the surface of a hot plate to heat the substrate at 120° C. for 10 minutes. The cobalt carbonyl complex on the second substrate was sublimated by heating with radiation heat from the heated first substrate, and a silver white film having a thickness of 200 nm was formed on the first substrate. When SIMS analysis was made on this film, it was found that the film was made of cobalt metal. The resistivity of this cobalt film was 18 µΩ·cm.

After the formation of the cobalt film, the weight of the cobalt carbonyl complex remaining on the second substrate was 0 mg, and the residual ratio was 0%.

Example B-5

A cobalt film was formed on the first substrate in the same manner as in Example B-4 except that the cobalt carbonyl complex composition which had been left and kept for 1 month in the above Example B-2 was used as the cobalt carbonyl complex composition.

As a result, the obtained cobalt film had a thickness of 200 nm and a resistivity of 18 µΩ·cm. After the formation of the cobalt film, the weight of the cobalt carbonyl complex remaining on the second substrate was 0 mg, and the residual ratio was 0%.

Example B-6

A cobalt film was formed on the first substrate in the same manner as in Example B-4 except that the cobalt carbonyl complex composition which had been left and kept for 1 month in the above Example B-3 was used as the cobalt carbonyl complex composition.

As a result, the obtained cobalt film had a thickness of 200 nm and a resistivity of 18 µΩ·cm.

After the formation of the cobalt film, the weight of the cobalt carbonyl complex remaining on the second substrate was 0 mg, and the residual ratio was 0%.

Comparative Example B-2

A cobalt film was formed on the first substrate in the same manner as in Example B-4 except that the cobalt carbonyl complex composition which had been left and kept for 1 month in the above Comparative Example B-1 was used as the cobalt carbonyl complex composition.

As a result, the obtained cobalt film had a thickness of 190 nm and a resistivity of 20 µΩ·cm. After the formation of the cobalt film, the weight of the cobalt carbonyl complex remaining on the second substrate was 4 mg, and the residual ratio was 13%.

Effect of the Invention

The container containing a cobalt carbonyl complex of the present invention can store a cobalt carbonyl complex contained therein stably. The cobalt carbonyl complex composition of the present invention can store a cobalt carbonyl complex contained therein stably. The cobalt carbonyl complex contained in the container and the composition can retain its sublimation properties for a long time without being converted into a stable complex. Therefore, when a cobalt film is formed by using the container containing a cobalt carbonyl complex of the present invention or the cobalt carbonyl complex composition of the present invention, a high-quality cobalt film can be formed by a simple process, and the production cost of the cobalt film can be reduced due to high use efficiency of the precursor.

The cobalt film formed by the above method is homogeneous with a uniform thickness and high quality and can be advantageously used as a seed layer for burying copper into trenches by plating and as a barrier layer at the interface between an insulator and copper.

The invention claimed is:

1. A method of storing a cobalt carbonyl complex, comprising bubbling a gas comprising carbon monoxide into a solvent to produce a solution comprising 0.001 to 1 wt. % of carbon monoxide; and
   dissolving a cobalt carbonyl complex in said solution;
   or
   dissolving a cobalt carbonyl complex in a solvent to produce a cobalt carbonyl complex solution; and
   bubbling a gas comprising carbon monoxide into said cobalt carbonyl complex solution to produce a solution comprising 0.001 to 1 wt. % of carbon monoxide.

2. The method according to claim 1, wherein said cobalt carbonyl complex is represented by any one of the following formulas (1) to (4):

$$Co_2(CO)_8 \tag{1}$$

$$Co_3(CO)_9CZ \tag{2}$$

(Z is a hydrogen atom, halogen atom, methyl group, methoxy group or trifluoromethyl group)

$$Co_3(CO)_{12} \tag{3}$$

$$Co_4(CO)_{12} \tag{4}$$

3. The method according to claim 1, wherein said solvent is at least one selected from the group consisting of an aliphatic hydrocarbon, an alicyclic hydrocarbon, an aromatic hydrocarbon, an alcohol, an ether, a ketone and a halogenated hydrocarbon.

4. The method according to claim 1, wherein said solvent is at least one selected from the group consisting of an aliphatic hydrocarbon and an aromatic hydrocarbon.

* * * * *